US012706150B2

(12) United States Patent
Jiang et al.

(10) Patent No.: US 12,706,150 B2
(45) Date of Patent: Aug. 11, 2026

(54) PROGRAMMING METHODS FOR MEMORY DEVICES, MEMORY DEVICES AND MEMORY SYSTEMS TO DECREASE PROGRAMMING TIME OF A PROGRAMMING OPERATION

(71) Applicant: Yangtze Memory Technologies Co., Ltd., Wuhan (CN)

(72) Inventors: SongMin Jiang, Wuhan (CN); Man Hu, Wuhan (CN); Yuanyuan Min, Wuhan (CN); HongTao Liu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 77 days.

(21) Appl. No.: 18/671,476

(22) Filed: May 22, 2024

(65) Prior Publication Data

US 2025/0273269 A1 Aug. 28, 2025

(30) Foreign Application Priority Data

Feb. 27, 2024 (CN) ........................ 202410216948.4

(51) Int. Cl.
*G11C 16/04* (2006.01)
*G11C 16/10* (2006.01)

(52) U.S. Cl.
CPC .......... *G11C 16/10* (2013.01); *G11C 16/0483* (2013.01)

(58) Field of Classification Search
CPC ........................... G11C 16/10; G11C 16/0483
USPC .................................................... 365/185.11
See application file for complete search history.

(56) References Cited

U.S. PATENT DOCUMENTS 7,436,709 B2 * 10/2008 Higashitani ........ G11C 16/0483 365/185.23
7,672,158 B2 * 3/2010 Nakamura ............ G11C 16/10 365/185.17
7,894,263 B2 * 2/2011 Lee .................... G11C 16/0483 365/185.25
8,339,845 B2 * 12/2012 Kwon .................... G11C 16/10 365/185.17
9,530,506 B2 * 12/2016 Rabkin ............... G11C 11/5628
9,640,273 B1 * 5/2017 Chen ...................... G11C 16/24

* cited by examiner

*Primary Examiner* — Tha-O H Bui
(74) *Attorney, Agent, or Firm* — Hanley, Flight & Zimmerman, LLC

(57) ABSTRACT

A programming method for a memory device, a memory device and a memory system including applying first and second pass voltages with different ramp timings. The programming method includes: applying a programming voltage on a selected word line; applying a first pass voltage on a first word line adjacent to the selected word line; and applying a second pass voltage on a second word line adjacent to the selected word line, wherein the first pass voltage and the second pass voltage include at least two ramp phases, and the first pass voltage and the second pass voltage have different ramp timings in at least one ramp phase among other ramp phases after the first ramp phase, and the ramp timing is the timing when the voltage value starts to ramp up from a certain voltage value.

20 Claims, 15 Drawing Sheets

PROGRAMMING METHODS FOR MEMORY DEVICES, MEMORY DEVICES AND MEMORY SYSTEMS TO DECREASE PROGRAMMING TIME OF A PROGRAMMING OPERATION

REFERENCE TO RELATED APPLICATION

This application claims priority to and the benefit of Chinese Patent Application 202410216948.4, filed on Feb. 27, 2024, which is hereby incorporated by reference in its entirety.

TECHNICAL FIELD

Examples of the present application relate to the field of semiconductor technology, particularly to programming methods for memory devices.

BACKGROUND

A memory device is a storage apparatus for saving information in modern information technology. As a typical non-volatile semiconductor memory, NAND (Not-And) type memory has gradually become the mainstream product in the memory market due to its high storage density, controllable production cost, suitable programing and erasing speeds and retention characteristics.

BRIEF DESCRIPTION OF DRAWINGS

In the figures drawn not necessarily to scale, same reference numerals may describe similar parts in different views. Same numerals with different character suffixes may represent different instances of similar parts. The accompanying drawings illustrate various examples discussed in the present document in general by example rather than limitation.

DETAILED DESCRIPTION

Figure 1:
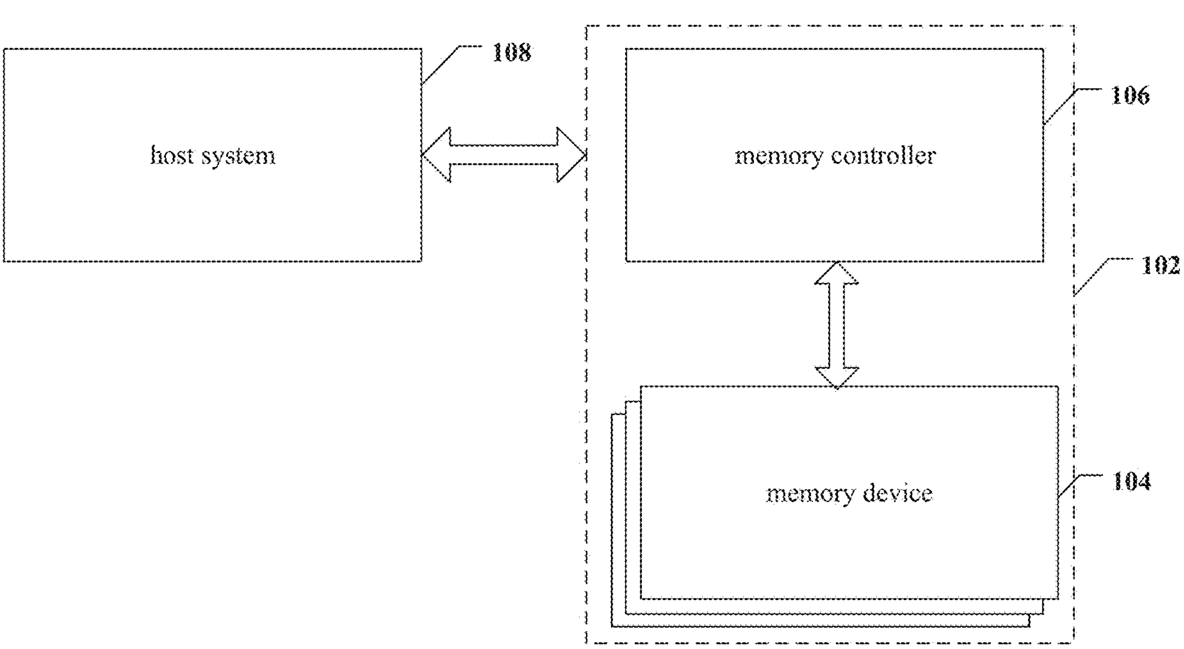
FIG. 1 is a block diagram of an example system having a memory system provided by an example of the present application.

Example implementations disclosed by the present application will be described in greater detail below with reference to the accompanying drawings. Although example implementations of the present application are shown in drawings, it is to be appreciated that the present application may be implemented in various forms rather than being limited to the specific implementations as set forth herein. In contrast, these implementations are provided to understand the present application more thoroughly and convey the scope of the present application completely to those skilled in the art.

In the following description, a large amount of specific details is presented to provide thorough understanding of the present application. However, it is obvious to one skilled in the art that the present application may be implemented without one or more of these details. In other examples, in order to avoid confusion with the present application, some technical features well known in the art are not described. That is, not all features of the practical examples are described herein, and well-known functions and structures are not described in detail.

In the accompanying drawings, sizes and relative sizes of layers, regions and elements may be exaggerated for purpose of clarity. The same reference numerals refer to the same elements throughout the specification.

It should be understood that while an element or a layer is said to be "on", "adjacent to", "connected to" or "coupled to" other elements or layers, it may be directly on, adjacent to, connected to or coupled to other elements or layers, or there may be intervening elements or layers. To the contrary, while an element is said to be "directly on", "directly adjacent to", "directly connected to" or "directly coupled to" other elements or layers, there is no intervening elements or layers. It is to be appreciated that although terms such as first, second, third etc. may be used to describe elements, components, regions, layers and/or parts, these elements, components, regions, layers and/or parts should not be limited by these terms. These terms are only used to differentiate one element, component, region, layer or part from another element, component, region, layer or part. Therefore, the first element, component, region or part discussed below may represent the second element, component, region, layer or part, without departing from the teaching of the present application. While discussing the second element, component, region, layer or part, it does not necessarily indicate there is the first element, component, region, layer or part in the present application.

Spatial relationship terms such as "under", "below", "beneath", "over", "on" etc. may be used herein for convenient description to describe the relationship of one element or feature shown in the drawings relative to other elements or features. It is to be appreciated that spatial relationship terms are further intended to include different orientations of devices in use and operation in addition to orientations shown in the figures. For example, if the device in a figure is inverted, then an element or feature described as "under" or "below" or "beneath" another element or feature will be oriented as "on" the other element or feature. Accordingly, example terms "under" and "below" may include two orientations of "on" and "under". A device may be otherwise oriented (rotated by 90 degrees or other orientations) and spatial description terms used herein should be interpreted accordingly.

Terms are used herein only for describing specific examples rather than limiting the present application. As used herein, the singular form "a", "an" and "the" are also intended to include the plural form unless otherwise stated in the context. It is also understood that while used in the description, term "consist" and/or "include" determines the presence of said features, integers, steps, operations, elements and/or components, but do not exclude the presence or addition of one or more other features, integers, steps, operations, elements and/or components. As used herein, the term "and/or" includes any and all combinations of relevant listed items.

In order to understand characteristics and technology contents of examples of the present application in more detail, examples of the present application will be described with reference to the accompanying drawings that are only for the purpose of reference rather than limiting examples of the present application.

It should be understood that "one example" or "an example" as mentioned throughout the description means that particular features, structures, or characteristics related to the example are included in at least one example of the present application. Therefore, "in one example" or "in an example" occurring throughout the description does not necessarily refer to the same example. In addition, these particular features, structures, or characteristics may be incorporated in one or more examples in any suitable manners. It should be understood that in various examples of the present application, the sequence numbers of the above-described processes do not mean the sequential order of executions. The execution order of the processes should be determined by their functions and internal logics and should not limit the implementation process of the examples of the present application. The sequence numbers of the above-described examples of the present application are only for the purpose of description rather than representing strengths and weaknesses of examples.

The methods disclosed in the method examples provided in the present application may be combined in any manner without conflicts to obtain new method examples.

The examples of the present application will be described in more detail below with respect to accompany drawings and specific examples.

However, with the continuously increasing demands for the storage apparatus, there are many spaces for improvements for memory devices and systems thereof.

FIG. 1 illustrates a schematic diagram of an example system having a memory system provided according to an example of the present application. In FIG. 1, the system 100 can be a mobile phone, a desktop computer, a laptop computer, a tablet, a vehicle computer, a gaming console, a printer, a positioning apparatus, a wearable electronic apparatus, a smart sensor, a virtual reality (VR) apparatus, an argument reality (AR) apparatus, or any other suitable electronic apparatus having memories therein. As shown in FIG. 1, the system 100 may include a host 108 and a memory system 102, wherein the memory system 102 has one or more memories 104 and a memory controller 106, the host 108 may be a processor of the electronic apparatus such as a central processing unit (CPU) or a system-on-chip (SoC), in which the SoC may be for example an application processor (AP). The host 108 may be configured to send data to the memory device 104 or receive data from the memory device 104. In an example, the memory device 104 may be any of the memories disclosed in the present application, for example, phase change random access memories (PCRAM) and three dimension NAND flashes etc.

According to some implementations, the memory controller 106 is coupled to the memory device 104 and the host 108, and is configured to control the memory device 104. The memory controller 106 can manage the data stored in the memory device 104 and communicate with the host 108. In some examples, the memory controller 106 is designed for operating in a low duty-cycle environment such as secure digital (SD) cards, compact Flash (CF) cards, universal serial bus (USB) Flash drives, or other media for use in electronic apparatuses of low duty-cycle environments such as personal computers, digital cameras, mobile phones, etc. In some examples, the memory controller 106 is designed for operating in high duty cycle environments such as solid-state drives (SSDs) or embedded multimedia cards (eMMCs), wherein SSDs or eMMCs are used as e.g., data stores and enterprise memory arrays of the mobile apparatuses of high duty cycle environments such as smart phones, tablet computers and laptop computers, etc. The memory controller 106 can be configured to control operations of the memory device 104, such as read, erase, and programming operations. The memory controller 106 can also be configured to manage various functions with respect to the data stored or to be stored in the memory device 104 including, but not limited to bad-block management, garbage collection, logical-to-physical address conversion, wear leveling, etc. In some implementations, the memory controller 106 is further configured to process error correction codes (ECCs) with respect to the data read from or written to the memory device 104. Any other suitable functions may be performed by the memory controller 106 as well, for example, formatting the memory device 104. The memory controller 106 can communicate with an external device (e.g., the host 108) according to a particular communication protocol. For example, the memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2:
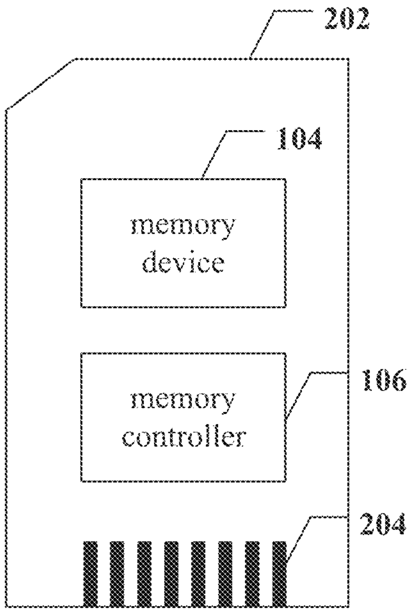
FIG. 2 is a block diagram of an example memory card having a memory system provided by an example of the present application.
Figure 3:
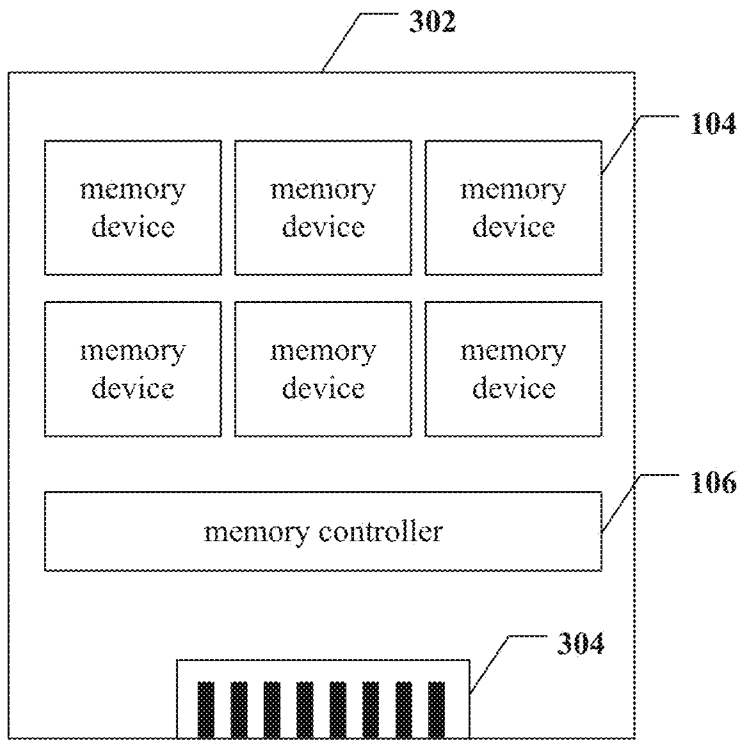
FIG. 3 is a diagram of an example solid-state drive having a memory system provided by an example of the present application.

In some examples, the memory controller 106 and one or more memory devices 104 can be integrated into various types of storage apparatuses, for example, be included in the same package, such as a universal Flash storage (UFS) package or an eMMC package. That is, the memory system 102 can be implemented and packaged into different types of terminal electronic products. In one example as shown in FIG. 2, the memory controller 106 and a single memory device 104 can be integrated into a memory card 202. The memory card may include a PC card (PCMCIA, Personal Computer Memory Card International Association), a CF card, a smart media (SM) card, a memory stick, a multimedia card (MMC, RS-MMC, MMCmicro), a SD card (SD, miniSD, microSD, SDHC), a UFS etc. The memory card may also include a memory card connector 204 coupling the memory card and the host (e.g., the host 108 in FIG. 1). In another example as shown in FIG. 3, the memory controller 106 and multiple memory devices 104 can be integrated into a solid-state drive (SSD) 302. The SSD may also include an SSD connector 304 coupling the SSD and the host (e.g., the host 108 in FIG. 1). In some implementations, the memory capacity and/or operating speed of SSD are greater than the memory capacity and/or operating speed of the memory card. Furthermore, the memory controller 106 can be further configured to control the read, erase, and write operations of the memory device 104.

Figure 4:
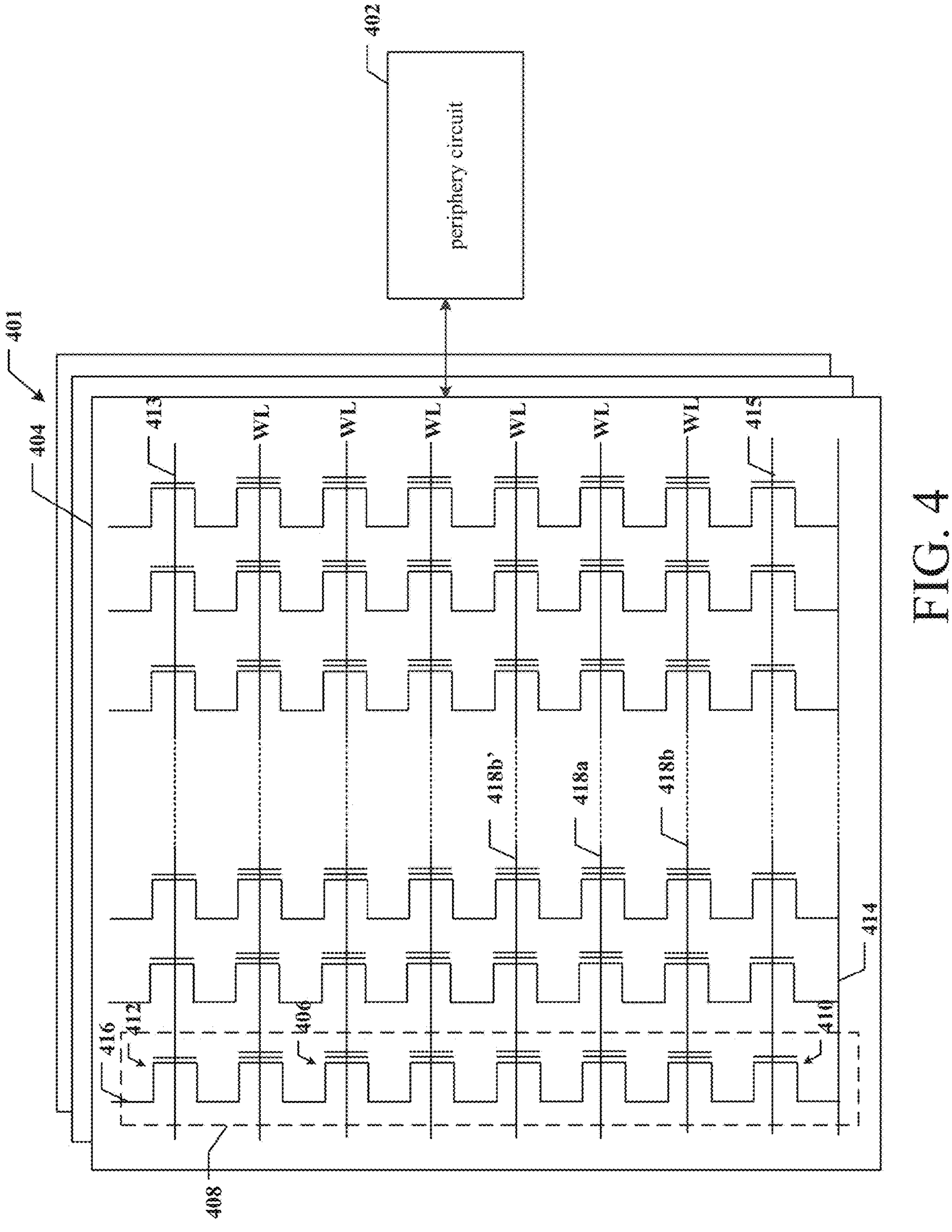
FIG. 4 is a schematic diagram of an example memory device containing peripheral circuits provided by an example of the present application.

As shown in FIG. 4, the memory device 104 may include a memory cell array 401 and peripheral circuits 402 coupled with the memory cell array 401, wherein the memory cell array 401 may be a NAND flash memory array, wherein the memory cells 406 are provided in form of an array of NAND memory strings 408 and each NAND memory string 408 extends vertically over the substrate (not shown). In some examples, each NAND memory string 408 includes a plurality of memory cells 406 coupled in series and stacked vertically. Each memory cell 406 can retain continuous analog values, for example, voltages or charges, depending on the number of electrons trapped in the storage region of the memory cell 406. Each memory cell 406 may be a memory cell of a floating-gate type that includes floating-gate transistors or a memory cell of a charge trapping type that includes charge trapping transistors.

In some examples, each memory cell 406 is a single-level cell (SLC) that has two possible data states and can therefore store one bit of data. For example, the first data state "0" may correspond to the first voltage range, and the second data state "1" may correspond to the second voltage range. In some examples, said first voltage range and said second voltage range may be referred to as the threshold voltage distribution of a memory cell. In some examples, each memory cell 406 may be a multi-level cell (MLC). For example, an MLC may store two bits per cell (also referred to as double level cell (DLC)); or as another example, store three bits per cell (also referred to as TLC, Trinary Level Cell); or store four bits per cell (also referred to as QLC, Quadruple Level Cell). Among them, data states of whatever types of memory cells contain one erasing state and (one or more) programming states, and when a programming operation is performed to the memory cells, the memory cells in erasing state are programmed to a certain programming state. Generally, the voltage value in the voltage range corresponding to the programming state of a memory cell is larger.

As shown in FIG. 4, each NAND string 408 may include a source select gate (SSG) 410 at its source end and a drain select gate (DSG) 412 at its drain end. SSG 410 and DSG 412 may be configured to activate the selected NAND memory string 408 (a column of the array) during reading and programming (or writing) operations. In some examples, sources of NAND memory strings 408 in the same memory block 404 are coupled through the same source line (SL) 414, such as the common SL. In other words, according to some implementations, all NAND memory strings 408 in the same memory block 404 have an array common source (ACS). According to some implementations, DSG 412 of each NAND memory string 408 is coupled to a corresponding bit line 416 and data may be read from and written into the bit line 416 via an output bus (not shown). In some examples, each NAND memory string 408 is configured to be selected or deselected by applying a select voltage (for example higher than the threshold voltage of the transistor having DSG 412) or a deselect voltage (for example, 0V) to the corresponding DSG 412 via one or more drain select line or top select line 413 and/or applying a select voltage (for example higher than the threshold voltage of the transistor having SSG 410) or a deselect voltage (for example, 0V) to the corresponding SSG 410 via one or more source select line or bottom select line 415.

As shown in FIG. 4, the NAND memory string 408 may be organized into a plurality of memory blocks 404 and each of the plurality of memory block 404 may have a common source line 414 (coupled to ground for example). In some examples, each memory block 404 is the basic data unit having erase operation. That is, all memory cells 406 on the same memory block 404 are erased at the same time. In order to erase the memory cells 406 in a selected memory block 404, it is possible to bias the source line 414 coupled to the selected memory block 404 and the unselected memory blocks 404 in the same plane as the selected memory block 404 with an erase voltage (Vers) (for example, a high positive voltage of 20V or higher). It will be appreciated that in some examples, it is possible to execute erase operation at a semi-block level, a quarter-block level or a level of any suitable number of blocks or any suitable fraction of a block. As shown in FIG. 4, memory cells 406 of adjacent NAND memory strings 408 may be coupled via word line 418. That is, the same word line 418 may be coupled with memory cells in same locations (namely corresponding memory cells) in a plurality of memory strings.

Figure 5:
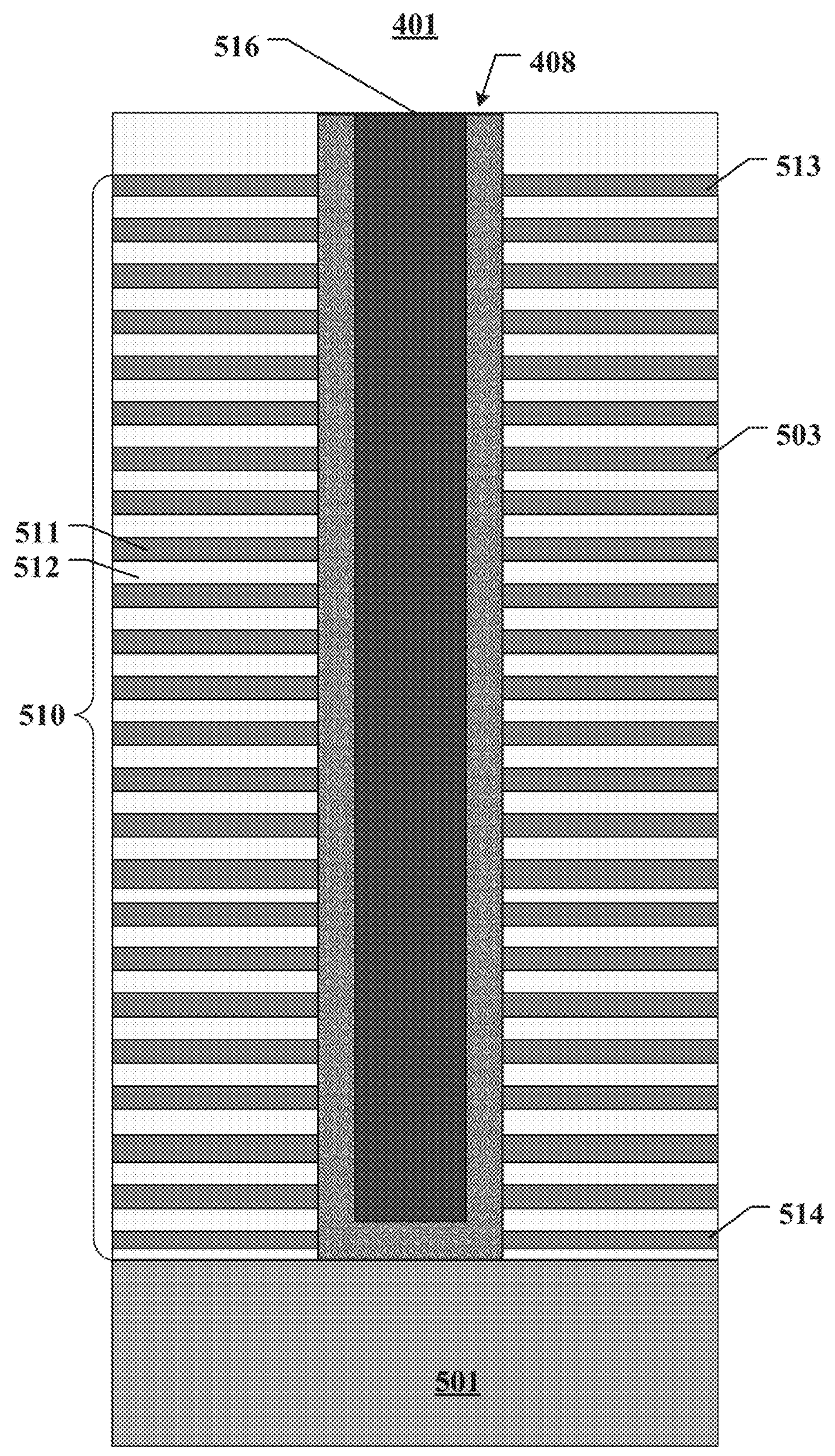
FIG. 5 is a sectional diagram of an example memory cell array containing NAND memory strings provided by an example of the present application.

FIG. 5 shows a side view of a section of an example memory cell array 401 including NAND memory strings 408 according to some aspects of the present application. As shown in FIG. 5, a NAND memory string 408 may include a stack structure 510 including a plurality of gate layers 511 and a plurality of insulating layers 512 stacked alternatively and the memory string 408 penetrating the gate layers 511 and the insulating layers 512 vertically. The gate layers 511 and the insulating layers 512 may be stacked alternatively and adjacent two gate layers 511 are separated by an insulating layer 512. The number of the pairs of gate layers 511 and insulating layers 512 in the stack structure 510 may determine the number of the memory cells included in the memory cell array 401.

The material for the gate layers 511 may include conductive materials. The conductive materials include, but are not limited to tungsten (W), cobalt (Co), copper (Cu), aluminum (Al), polysilicon, doped silicon, silicide or any combination thereof. In some implementations, each gate layer 511 includes a metal layer such as a tungsten layer. In some implementations, each gate layer 511 includes a doped polysilicon layer. Each gate layer 511 may include a control gate surrounding the memory cells. The gate layer 511 on top of the stack 510 may extend laterally to serve as the top select gate line 513, i.e., TSG line 413, wherein the top select gate line 513 is the leading-out line for the top select gate (TSG) 412 as described above to connect to corresponding select voltage or de-select voltage. The gate layer 511 at the bottom of the stack structure 510 may extend laterally to serve as the bottom select gate line 514, i.e., source select line or bottom select line 415, wherein the bottom select gate line 514 is the leading-out line for the bottom select gate (BSG) 410 as described above to connect to corresponding select voltage or de-select voltage. The gate layer 511 extending laterally between the top select gate line and the bottom select gate line may serve as word line layers 503, which are the above-described word lines 418.

In some examples, the stack structure 510 may be disposed on the substrate 501. The substrate 501 may include silicon (e.g., single crystalline silicon), silicon germanium (SiGe), gallium arsenide (GaAs), germanium (Ge), silicon-on-insulator (SOI), germanium-on-insulator (GOI) or any other suitable material.

In some examples, the NAND memory string 408 includes a channel structure 516 extending vertically through the stack structure 510. In some implementations, the channel structure includes a channel hole filled with semiconductor material(s) (e.g., serving as the semiconductor channel) and dielectric material(s) (e.g., serving as the memory film). In some implementations, the semiconductor channel includes silicon, such as polysilicon. In some implementations, the memory film is a composite dielectric layer including a tunneling layer, a storage layer (also known as "charge trapping/storage layer") and a barrier layer. The channel structure may have a cylindrical shape (e.g., a pillar shape). According to some implementations, the semiconductor channel, the tunneling layer, the storage layer and the barrier layer are arranged radially from the center of the pillar towards the outer surface in this order. The tunneling layer may include silicon oxide, silicon oxynitride or any combination thereof. The storage layer may include silicon nitride, silicon oxynitride or any combination thereof. The barrier layer may include silicon oxide, silicon oxynitride, high dielectric constant (high-k) dielectric or any combination thereof. In one example, the memory film may include a composite layer of silicon oxide/silicon oxynitride/silicon oxide (ONO).

Figure 6:
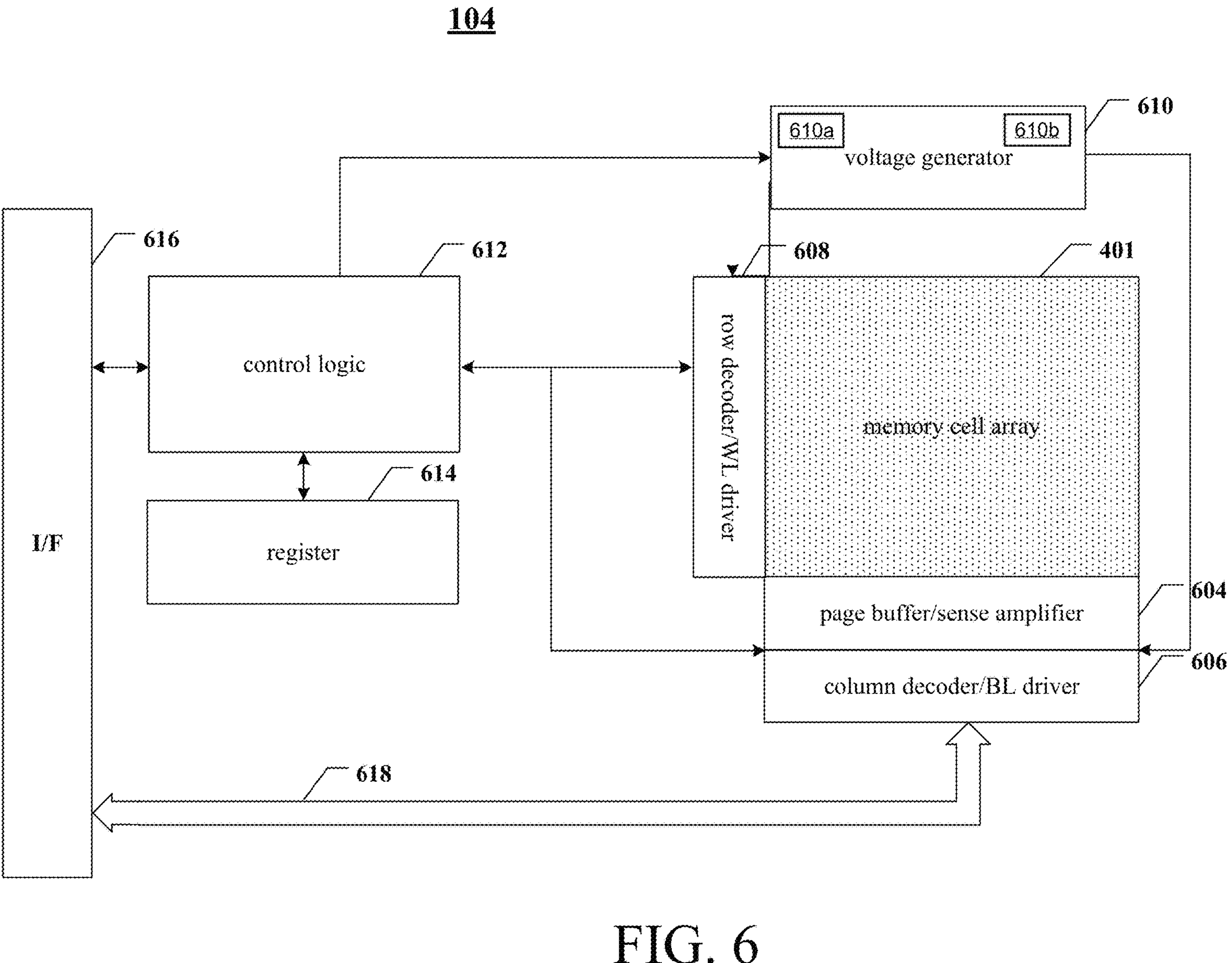
FIG. 6 is a structural diagram of a peripheral circuit of the memory device provided in an example of the present application.

Referring back to FIG. 4, the peripheral circuits 402 may be coupled to the memory cell array 401 through the bit line 416, the word line 418, the source line 414, the SSG line 415 and the DSG line 413. The peripheral circuits 402 may include any suitable analog, digital and hybrid signal circuits for facilitating operation of the memory cell array 401 by applying voltage signals and/or current signals to each target memory cell 406 via bit lines 416, word lines 418, source lines 414, SSG lines 415 and DSG lines 413 and sensing voltage signals and/or current signals from each target memory cell 406. The peripheral circuits 402 may include various types of peripheral circuits formed by metal-oxide-semiconductor (MOS) technology. As an example, FIG. 6 shows some example peripheral circuits. The peripheral circuit 402 may include a page buffer/sense amplifier 604, a column decoder/bit line driver 606, a row decoder/word line driver 608, a voltage generator 610, a control logic 612, a register 614, an interface 616 and a data bus 618. It should be understood that in some examples, additional circuits not shown in FIG. 6 may be further included.

Specifically, the page buffer/sense amplifier 604 may be configured to read and program (write) data from/to the memory cell array 401 according to control signals from control logic 612. In one example, the page buffer/sense amplifier 604 may store programming data (or known as writing data) to be programed into memory cells coupled with one word line in the memory cell array 401. In another example, the page buffer/sense amplifier 604 may execute the programming verification operation to ensure that the data has been properly programed into the memory cells 406 coupled to the selected word line 418. In yet another example, the page buffer/sense amplifier 604 may also sense a low-power signal from a bit line 416 indicating the data bit stored in a memory cell 406 and amplify the small voltage swing to an identifiable logic level in the read operation. The column decoder/bit line driver 606 may be configured to be controlled by the control logic 612 and select one or more NAND memory strings 408 by applying a bit line voltage generated by the voltage generator 610.

The row decoder/word line driver 608 may be configured to be controlled by the control logic 612, and select/deselected memory blocks 404 of the memory cell array 401 and select/deselect word lines 418 of the memory block 404. The row decoder/word line driver 608 may be further configured to drive word lines 418 using word line voltages generated by the voltage generator 610 so as to implement the programming operation, read operation on memory cells 406 coupled to selected word line(s) 418. In some implementations, the row decoder/word line driver 608 may also select/deselect and drive SSG lines 415 and DSG lines 413. The voltage generator 610 may be configured to be controlled by the control logic 612 and generate word line voltages to be supplied to the memory cell array 401 (such as read voltage, programming voltage, pass voltage, local voltage and verification voltage), the bit line voltage and the source line voltage etc.

The control logic 612 may be coupled to each circuit described above and configured to control operations of each peripheral circuit. The register 614 may be coupled to the control logic 612 and include a status register, a command register and an address register to store status information, command operation codes (OP codes) and command addresses for controlling operations of each peripheral circuit. The interface 616 may be coupled to the control logic 612, and serve as a control buffer to buffer control commands received from the host (not shown) and relay them to the control logic 612, and buffer status information received from the control logic 612 and relay them to the host. The interface 616 may be further coupled to the column decoder/bit line driver 606 via the data bus 618 and serve as a data I/O interface and a data buffer to buffer data and relay it to the memory cell array 401 or relay or buffer data from the memory cell array 401.

Figure 7:
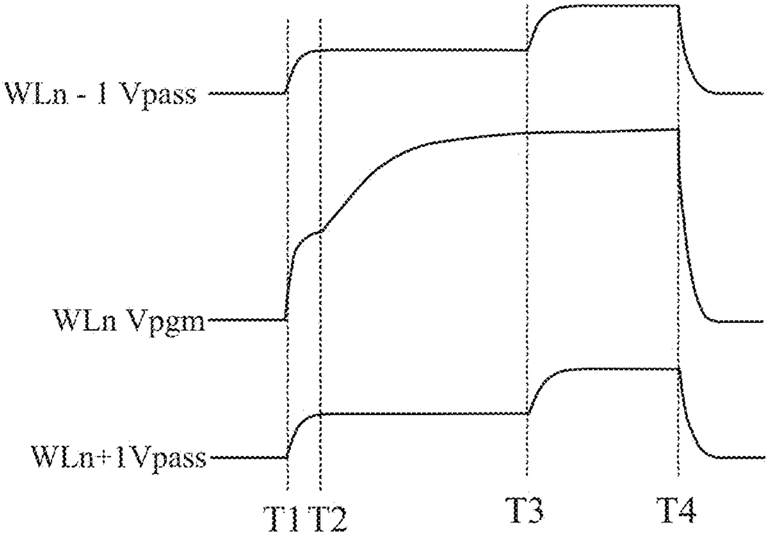
FIG. 7 is a schematic diagram I of voltage waveforms of respective word lines upon programming provided by an example of the present application.

In some specific examples, for a certain programming operation, it may include a plurality of phases. In an example, the programming operation may include a channel precharging phase, a channel boosting phase, a programming pulsing phase and a recovery phase, a voltage waveform of which is shown in FIG. 7. In the channel precharging phase (T1~T2), a voltage generator may generate a voltage required in the next phase, for example, voltages to be applied on gates or channel boosting voltage. In the channel boosting phase (T2~T3), it is possible to apply the channel boosting voltage on the selected word line. In the programming pulsing phase (T3~T4), it is possible to apply the target voltage for each programming on the selected word line. In the recovery phase (after T4), it is possible to reduce the voltages on the unselected word line and selected word line to corresponding voltages such as Vcc and Vdd. In the recovery phase, it is possible to achieve the purpose by one or more stepwise voltage reduction to the corresponding voltages. For example, it is possible to first reduce the voltages to intermediate voltages and maintain at the intermediate voltages for a while, and then reduce the voltages to the corresponding voltages.

Figure 8:
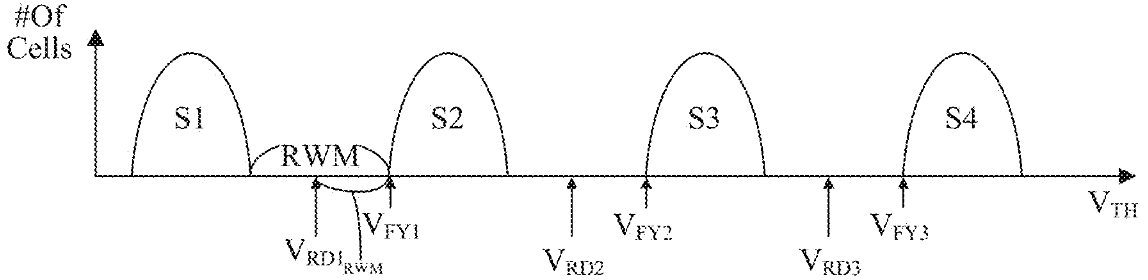
FIG. 8 is a schematic diagram of a threshold voltage distribution of a DLC type memory cell provided by an example of the present application.
Figure 9:
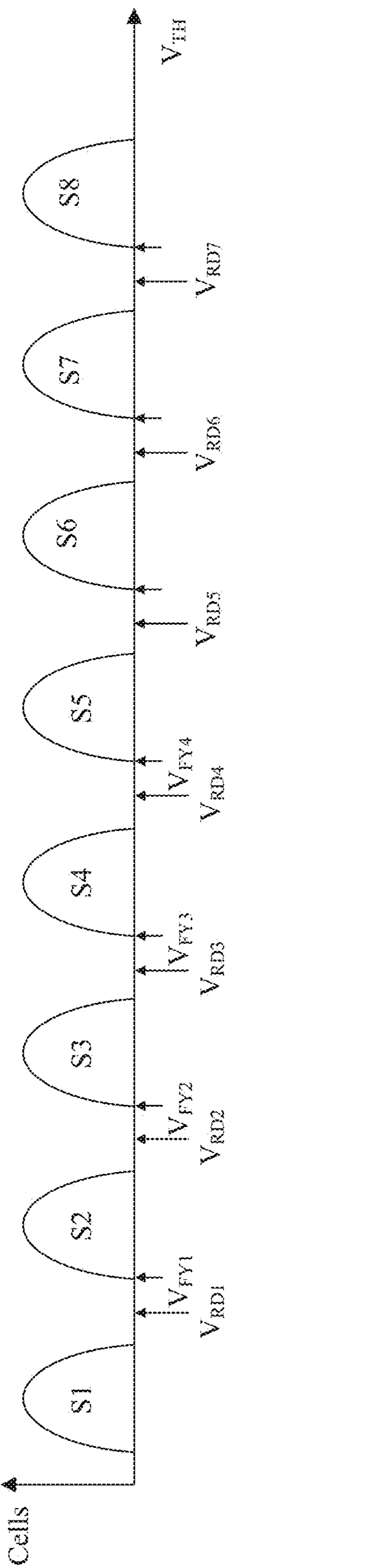
FIG. 9 is a schematic diagram of a threshold voltage distribution of a TLC type memory cell provided by an example of the present application.
Figure 10:
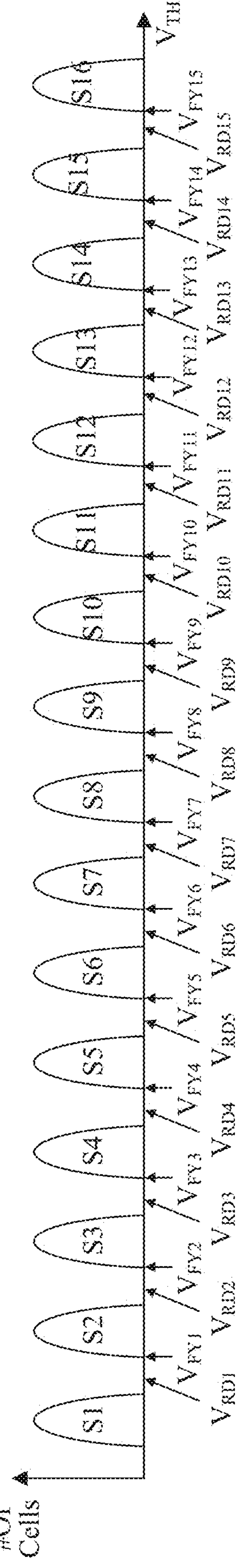
FIG. 10 is a schematic diagram of a threshold voltage distribution of a QLC type memory cell provided by an example of the present application.

For the above-described memory system and memory, the read window margin (RWM) is an important parameter indicating a correct reading of the data from memory cells. There are two kinds of definitions for RWM. As the first definition, RWM is the sum of intervals between threshold voltage distributions corresponding to adjacent two data states of memory cells. For example, the threshold voltage distribution of the MLC type memory cell illustrated in FIG. 8 will be described as an example. As shown in FIG. 8, the first RWM of the memory cells of MLC type (namely DLC type) may be the voltage interval between the erasing state S1 and the programming state S2. As the second definition, RWM may be defined as the voltage interval between the programming verification voltage for the programming state of the memory cell and the read voltage for distinguishing between the programming state and its adjacent data state. For example, the RWMs contained in FIG. 8 are: the voltage interval between $V_{RD1}$ and the maximum value of the threshold voltage distribution of erasing state S1, the voltage interval between $V_{RD1}$ and $V_{FY1}$, the voltage interval between $V_{RD2}$ and the maximum value of the threshold voltage distribution of the first programming state S2, the voltage interval between $V_{RD2}$ and $V_{FY2}$, the voltage interval between $V_{RD3}$ and the maximum value of the threshold voltage distribution of the second programming state S3, and the voltage interval between $V_{RD3}$ and $V_{FY3}$, wherein $V_{RD1}$, $V_{RD2}$, $V_{RD3}$ are the read voltage for distinguishing between the erasing state S1 and the programming state S2, the read voltage for distinguishing between the programming state S2 and the programming state S3, the read voltage for distinguishing between the programming state S3 and the programming state S4; and $V_{FY1}$, $V_{FY2}$, $V_{FY3}$ are programming verification voltage of programming state S2, programming verification voltage of programming state S3 and programming verification voltage of programming state S4, respectively. With the further increase of the density with which a single memory cell can store data, width of the RWM is reduced. For example, for the threshold voltage distribution of the TLC type memory cell shown in FIG. 9 and the threshold voltage distribution of the QLC type memory cell shown in FIG. 10, they demonstrate RWMs narrower than the RWM corresponding to the DLC type memory cell shown in FIG. 8. While conducting a read operation on the memory device, an RWM of sufficiently wide is necessary to correctly read data from memory cells. For a 3D NAND flash memory, with the increasing number of layers stacked, the programming disturbance becomes severe due to the coupling effect between layers and other causes, thereby resulting in the insufficient width of the RWM.

Figure 11:
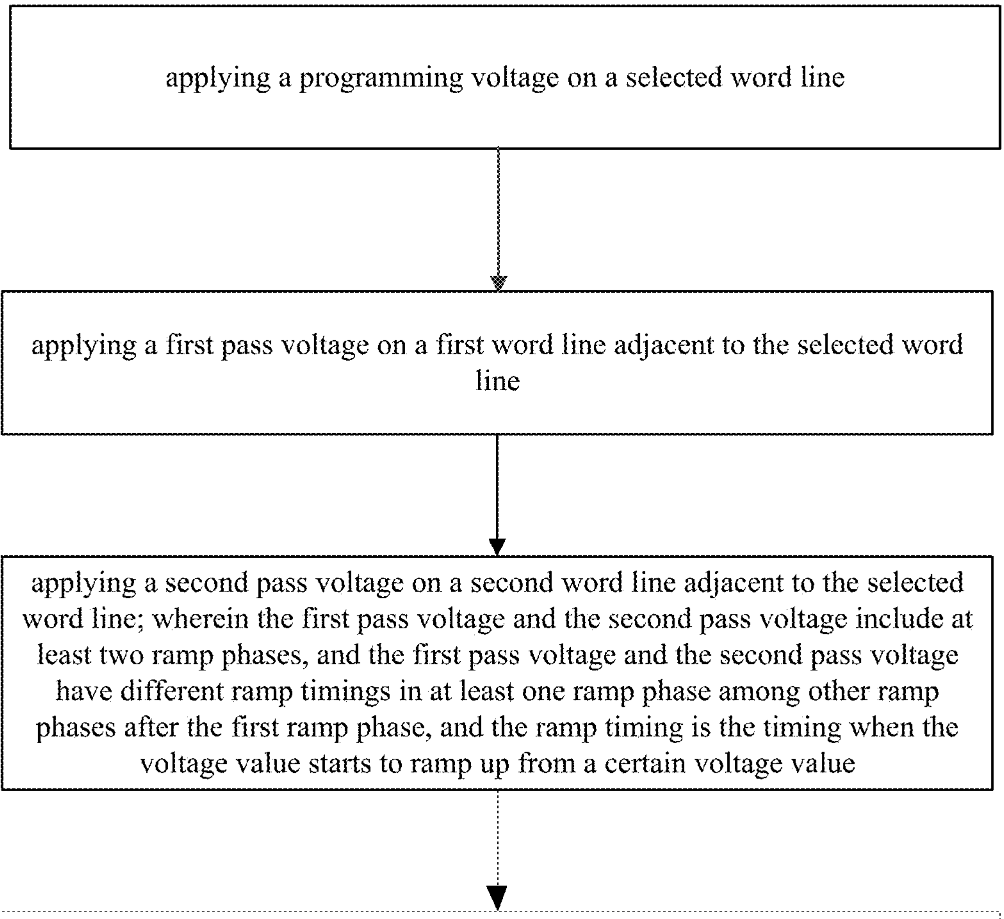
FIG. 11 is a flow chart of a programming method for a memory device provided by an example of the present application.

In order to address the above-described one or more technical problems, as shown in FIG. 11, an example of the present application provides a programming method for a memory device, which may include:

- applying a programming voltage on a selected word line; and
- applying a first pass voltage on a first word line adjacent to the selected word line; and applying a second pass voltage on a second word line adjacent to the selected word line;
- wherein the first pass voltage and the second pass voltage include at least two ramp phases, and the first pass voltage and the second pass voltage have different ramp timings in at least one ramp phase among other ramp phases after the first ramp phase, and the ramp timing is the timing when the voltage value starts to ramp up from a certain voltage value.

Here, the selected word line may be the word line 418 coupled with the memory cell to be programmed (or the memory cell to be written with data). The first word line adjacent to the selected word line and the second word line adjacent to the selected word line may be the word lines coupled with the memory cells in the layers on and under the layer of memory cell coupled with the selected word line as shown in FIG. 4. In an example, as shown in FIG. 4, assuming that the selected word line is word line 418*a*; the first word line and the second word line may be the word lines adjacent to the word line 418*a*, i.e. the word line 418*b* and word line 418*b*', or the first word line and the second word line may be the word line adjacent to the word line 418*a*, i.e. the word line 418*b*' and word line 418*b*.

In view of this, the programming method provided in the examples of the present application may be: when programming the memory cell coupled with the selected word line, applying a programming voltage on the selected word line; applying a first pass voltage on a first word line adjacent to the selected word line; and applying a second pass voltage on a second word line adjacent to the selected word line; wherein the first pass voltage and the second pass voltage include at least two ramp phases, and the first pass voltage and the second pass voltage have different ramp timings in at least one ramp phase among other ramp phases after the first ramp phase, and the ramp timing is the timing when the voltage value starts to ramp up from a certain voltage value. That is, in the examples of the present application, during the programming of the memory cells coupled with the selected word line, the application of the pass voltages on the two unselected word lines such as first word line and second word line adjacent to the selected word line adopts at least two steps to ramp up, and after the first ramp phase of the pass voltages of the two unselected word lines, the pass voltages in at least one ramp phase have different ramp timings, thereby increasing the channel potential, improving programming disturb, and in turn increasing the RWM. At the same time, the first pass voltage and the second pass voltage start to ramp up from different timings and it is possible to make the programming voltage for the selected word line more uniform by the coupling effect between the word lines, thereby improving programming efficiency and shortening programming time.

Here, the expression that the first pass voltage and the second pass voltage have different ramp timings in at least one ramp phase among other ramp phases after the first ramp phase may include that: the ramp timing of at least one ramp phase of other ramp phases after the first ramp phase of the first pass voltage precedes the ramp timing of at least one ramp phase of other ramp phases after the first ramp phase of the second pass voltage, alternatively, the ramp timing of at least one ramp phase of other ramp phases after the first ramp phase of the second pass voltage precedes the ramp timing of at least one ramp phase of other ramp phases after the first ramp phase of the first pass voltage. Specific details are determined depending upon the practical situation.

Figure 12:
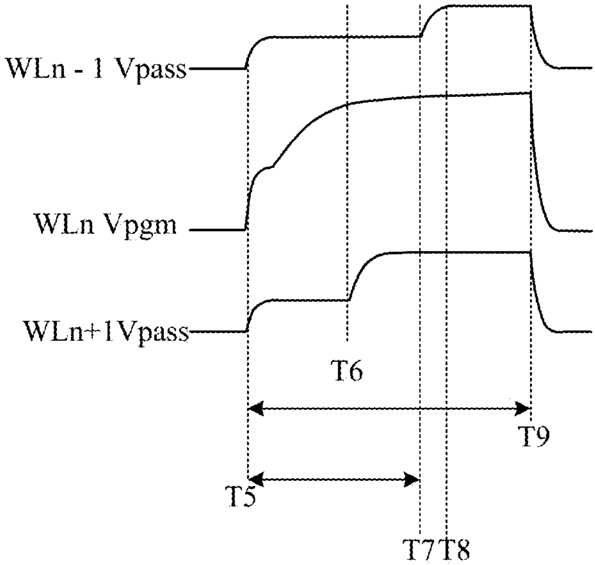
FIG. 12 is a schematic diagram II of voltage waveforms of respective word lines upon programming provided by an example of the present application.

An optional implementation is shown in FIG. 12 in which the at least two ramp phases may include two ramp phases and the ramp timing of the second ramp phase of the second pass voltage precedes the ramp timing of the second ramp phase of the first pass voltage.

As shown in FIG. 12, it is assumed that the selected word line is word line WLn, the first word line is word line WLn−1, and the second word line is WLn+1. At this time, the word line WLn is applied with the programming voltage Vpgm; the word line WLn−1 is applied with the first pass voltage; and the word line WLn+1 is applied with the second pass voltage. As shown in FIG. 12, each of the first pass voltage and the second pass voltage includes two ramp phases, and the ramp timing of the second ramp phase of the second pass voltage (i.e., ramping up at T6) precedes (or is earlier than) the ramp timing of the second ramp phase of the first pass voltage (i.e., ramping up at T7).

In some examples, the time interval between the ramp timing of the second ramp phase of the first pass voltage and the ramp timing of the second ramp phase of the second pass voltage is influenced by the pulse width of the programming voltage and the ramp speed of the ramp phase of the programming voltage.

That is, for the programming voltage waveform shown in FIG. 12, the time interval between T6 and T7 is influenced by the pulse width of the programming voltage applied on the selected word line and the ramp speed of the ramp phase of the programming voltage.

As shown in FIG. 12, the time interval between T5 and T9 is the pulse width of the programming voltage; and the time interval between T5 and T7 is the ramp phase of the programming voltage. Timing T8 is the timing when the first pass voltage reaches the maximum value.

It should be appreciated that in order to program the memory cells coupled with the word line WLn, in the same memory string, memory cells coupled with the word line WLn−1, the word line WLn+1 must be in on state. As can be seen from the programming voltage waveform shown in FIG. 12, the timing at which the first pass voltage ramps up to the maximum value cannot be later than the timing at which the programming voltage drops from the maximum value. That is, the timing at which the first pass voltage ramps up to the maximum value must precede the timing T9. Still further, the programming process takes a certain time. That is, the programming voltage is maintained at the maximum value for a period. Therefore, enough time should be reserved for programming, and the time interval between T8 and T9 cannot be too short. That is, the timing at which the first pass voltage ramps up to the maximum value must precede the timing T9 to reserve enough programming time. Then, the time interval between the ramp timing of the second ramp phase of the first pass voltage and the ramp timing of the ramp phase of the second pass voltage is influenced by the pulse width of the programming voltage. Still further, the pulse width of the programming voltage contains the voltage ramp phase and the maintaining phase when the voltage reaches the maximum voltage value. If a pulse width of the whole programming voltage is given, the length of the ramp phase influences the maintaining period of the maximum voltage value of the programming voltage, and in turn influences the time interval between the ramp timing of the second ramp phase of the first pass voltage and the ramp timing of the ramp phase of the second pass voltage.

In some examples, the first pass voltage and the second pass voltage are provided by different voltage sources. When the maximum voltage value of the first pass voltage is given, the speed at which the first pass voltage reaches the maximum voltage value is controlled by controlling the pulse widths of the respective ramp phases provided by the voltage sources. Alternatively, when the maximum voltage value of the second pass voltage is given, the speed at which the second pass voltage reaches the maximum voltage value is controlled by controlling the pulse widths of the respective ramp phases provided by the voltage sources.

Here, the first pass voltage and the second pass voltage have different ramp timings in at least one ramp phase among other ramp phases after the first ramp phase. Therefore, the first pass voltage and the second pass voltage are provided by different power sources. When the maximum voltage value of the first pass voltage is given, the speed at which the first pass voltage reaches the maximum voltage value is controlled by controlling the pulse widths of the respective ramp phases provided by the voltage sources. And, when the maximum voltage value of the second pass voltage is given, the speed at which the second pass voltage reaches the maximum voltage value is controlled by controlling the pulse widths of the respective ramp phases provided by the voltage sources.

Figure 13:
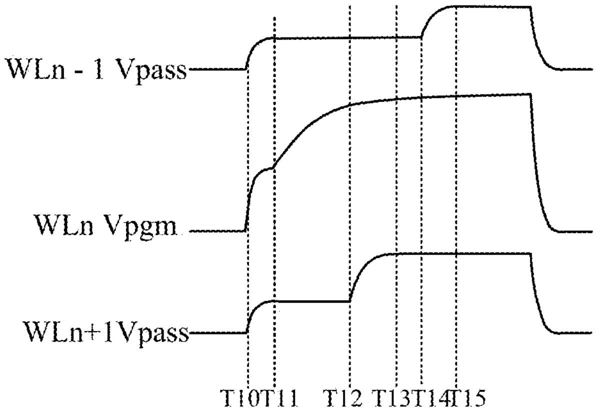
FIG. 13 is a schematic diagram III of voltage waveforms of respective word lines upon programming provided by an example of the present application.

Specifically, as shown in FIG. 13, between T10 and T11, and T14 and T15 are the two ramp phases of the first pass voltage; and between T10 and T11, and T12 and T13 are the two ramp phases of the second pass voltage. In case that the maximum voltage values of the first pass voltage and the second pass voltage are given, it is possible to control the speed at which the first pass voltage reaches the maximum voltage value by controlling the lengths of the periods between T10 and T11, and T14 and T15, namely the pulse width of the ramp phase. Similarly, it is possible to control the speed at which the second pass voltage reaches the maximum voltage value by controlling the lengths of the periods between T10 and T11, and T12 and T13, namely the pulse width of the ramp phase.

In some examples, after the respective ramp phases end, the maximum voltage value of the first pass voltage and the maximum voltage value of the second pass voltage are equal.

Based on the above description that during the process of programming memory cells coupled with the selected word line, the memory cells in the same memory string should be in on state, then since some memory cells in the same memory string have been programmed and some are in un-programmed state (namely erasing state), when applying pass voltage, corresponding pass voltages may be applied to memory cells depending on their data states, or a large pass voltage may be applied collectively such that memory cells other than those to be programmed in the same memory string are in on state, thereby simplifying operations.

Here, as shown in FIG. 13, after the respective ramp phases end, the maximum voltage value of the first pass voltage and the maximum voltage value of the second pass voltage being equal may indicate that the voltage value of the first pass voltage after T15 may be equal to the voltage value of the second pass voltage after T13.

In some examples, the method may further include:

applying the third pass voltage to word lines other than the first word line, the second word line and the selected word line;

wherein, after the respective ramp phases end, the maximum voltage value of the third pass voltage is different from the maximum voltage values of the first pass voltage and the second pass voltage.

Here, the mentioned third pass voltage is the pass voltage applied on other non-selected word lines other than the first word line and the second word line. Based on the above description, the maximum value of the third pass voltage is the same as the maximum value of the first pass voltage and the second pass voltage. However, in practical application process, considering other reasons, such as hot electron injection (HCI) that might be caused by a large pass voltage, different pass voltages are applied on memory cells in different layers (or coupled with word lines). That is, the maximum value of the third pass voltage may be different from the maximum value of the first pass voltage and the maximum value of the second pass voltage.

In some examples, the programming of memory cells coupled with the selected word line includes a plurality of pulse phases:

In the previous pulse phase, a first sub-programming voltage is applied to the selected word line. In the subsequent pulse phase, a second sub-programming voltage is applied to the selected word line. The voltage value of the first sub-programming voltage is smaller than the voltage value of the second sub-programming voltage.

Figure 14:
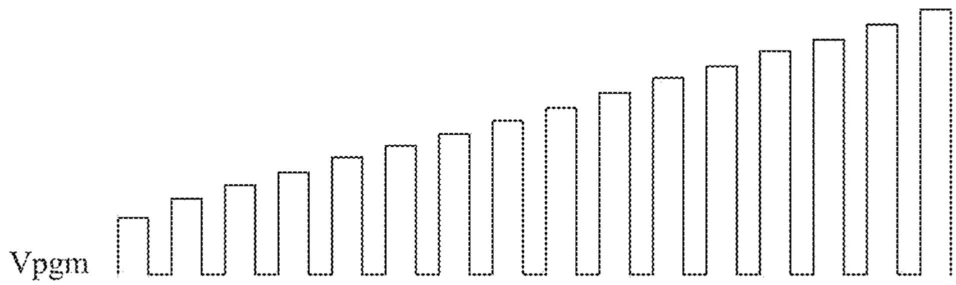
FIG. 14 is a structure diagram of stepping pulses of ISPP provided by an example of the present application.

What is described herein is the incremental step pulse programming (ISPP). That is, ISPP is used for memory cells coupled with the selected word line. Here, the so called ISPP may be such a manner in which a plurality of memory cells are programmed for several times while word line bias voltages are increased step by step based on step voltages such that the plurality of memory cells are programmed to corresponding data state in the plurality of data states. FIG. 14 may be referred to for the incremental step pulse Vpgm. That is, the programming pulses applied on the word line coupled with the programmed memory cells are increased gradually with a certain increment until the programmed memory cells are programmed to the target data state. It is to be noted that applying a programming pulse may be referred to as a programming loop (PGM Loop).

Here, that is, the programming of memory cells coupled with the selected word line includes a plurality of pulse phases each of which corresponds to a sub-programming voltage. As shown in FIG. 14, in the previous pulse phase, the voltage value of the applied first sub-programming voltage is smaller than the second sub-programming voltage applied in the subsequent pulse phase. The voltage waveform of each pulses phase may be the voltage waveform on word line WLn as shown in FIG. 12.

In some examples, the programming of memory cells coupled with the selected word line includes a plurality of pulse phases; wherein

- in the previous pulse phase, a first sub-pass voltage is applied on the first word line, and a second sub-pass voltage is applied on the second word line;
- in the subsequent pulse phase, a third sub-pass voltage is applied on the first word line, and a fourth sub-pass voltage is applied on the second word line;
- wherein, after the respective ramp phases end, the voltage value of the first sub-pass voltage is smaller than the voltage value of the third sub-pass voltage; and the voltage value of the second sub-pass voltage is smaller than the voltage value of the fourth sub-pass voltage.

Similarly, in the ISPP programming process, the pass voltage may be stepped. That is, in the previous pulse phase, the maximum voltage value of the first sub-pass voltage applied to the first word line is smaller than the maximum voltage value of the third sub-pass voltage applied to the first word line in the subsequent pulse phase. Similarly, in the previous pulse phase, the second sub-pass voltage applied to the second word line is smaller than the fourth sub-pass voltage applied to the second word line in the subsequent pulse phase.

In some examples, programming of memory cells coupled with the selected word line includes a plurality of pulse phases and in each pulse phase, each of the pass voltage applied to the first word line and the pass voltage applied to the second word line includes at least two ramp phases, and the pass voltage applied to the first word line and the pass voltage applied to the second word line have different ramp timings in at least one ramp phase among the other ramp phases after the first ramp phase.

It is to be noted that for each pulse phase in the plurality of pulse phases in ISPP programming process, the voltage waveforms on the selected word line, the first word line and the second word line may be as shown in FIG. 12, wherein the pass voltage applied to the first word line and the pass voltage applied to the second word line include at least two ramp phases, and have different ramp timing in at least one ramp phase among the other ramp phases after the first ramp phase.

The example of the present application provides a programming method, in which by adjusting the ramp timings of pass voltages applied to two word lines adjacent to the selected word line, such that the pass voltages have different ramp timings in at least one ramp phase among other ramp phases after the first ramp phase, the programming voltage on the selected word line may be more uniform by the couple effect between WLs, and programming efficiency may be improved, thereby improving programming disturb and increasing RWM.

Figure 15:
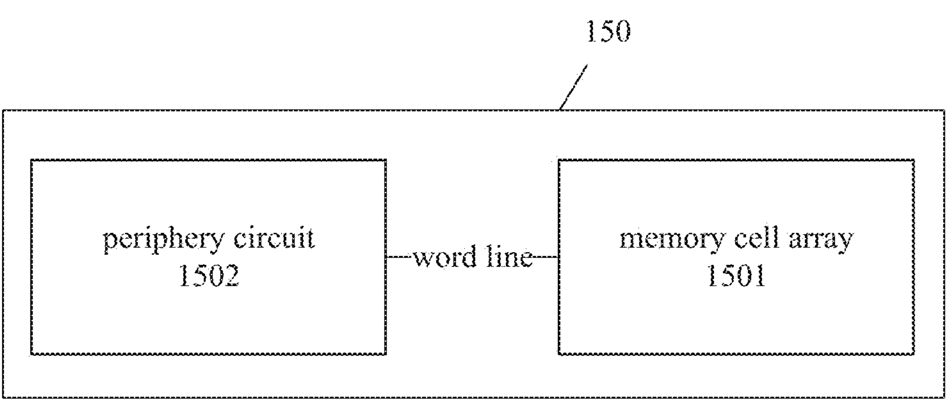
FIG. 15 is a structure diagram of a memory device provided by an example of the present application.

As shown in FIG. 15, according to another aspect of examples of the present application, there is provided a memory device 150, including: a memory cell array 1501 including a plurality of memory strings each including a plurality of memory cells;

- a plurality of word lines each coupled with a corresponding memory cell in each memory string; and
- a periphery circuit 1502 coupled with the plurality of word lines and configured to:
- apply a programming voltage on a selected word line;
- apply a first pass voltage on a first word line adjacent to the selected word line; and
- apply a second pass voltage on a second word line adjacent to the selected word line;
- wherein the first pass voltage and the second pass voltage include at least two ramp phases, and the first pass voltage and the second pass voltage have different ramp timings in at least one ramp phase among other ramp phases after the first ramp phase, and the ramp timing is the timing when the voltage value of the pass voltage starts to ramp up from a certain voltage value.

In some examples, the at least two ramp phases include two ramp phases and the ramp timing of the second ramp phase of the second pass voltage precedes the ramp timing of the second ramp phase of the first pass voltage.

In some examples, the time interval between the ramp timing of the second ramp phase of the first pass voltage and the ramp timing of the second ramp phase of the second pass voltage is influenced by the pulse width of the programming voltage and the ramp speed of the ramp phase of the programming voltage.

In some examples, said peripheral circuit further includes a first voltage source 610*a* and a second voltage source 610*b*, wherein:

- the first voltage source is configured to apply the first pass voltage to the first word line;
- the second voltage source is configured to apply the second pass voltage to the second word line;
- wherein when the maximum voltage value of the first pass voltage is given, the speed at which the first pass voltage reaches the maximum voltage value is controlled by controlling the pulse widths of the respective ramp phases provided by the first voltage source, and, when the maximum voltage value of the second pass voltage is given, the speed at which the second pass voltage reaches the maximum voltage value is controlled by controlling the pulse widths of the respective ramp phases provided by the second voltage source.

In some examples, the peripheral circuit is further configured to apply a third pass voltage to word lines other than the first word line, the second word line and the selected word line in the plurality of word lines; wherein, after the respective ramp phases end, the maximum voltage value of the third pass voltage is different from the maximum voltage values of the first pass voltage and the second pass voltage.

In some examples, the programming of memory cells coupled with the selected word line includes a plurality of pulse phases:

In the previous pulse phase, a first sub-programming voltage is applied to the selected word line. In the subsequent pulse phase, a second sub-programming voltage is applied to the selected word line. The voltage value of the first sub-programming voltage is smaller than the voltage value of the second sub-programming voltage.

In some examples, the programming of memory cells coupled with the selected word line includes a plurality of pulse phases; wherein in the previous pulse phase, a first sub-pass voltage is applied on the first word line, and a second sub-pass voltage is applied on the second word line;

in the subsequent pulse phase, a third sub-pass voltage is applied on the first word line, and a fourth sub-pass voltage is applied on the second word line;

wherein, after the respective ramp phases end, the voltage value of the first sub-pass voltage is smaller than the voltage value of the third sub-pass voltage; and the voltage value of the second sub-pass voltage is smaller than the voltage value of the fourth sub-pass voltage.

In some examples, programming memory cells coupled with the selected word line includes a plurality of pulse phases and in each pulse phase, each of the pass voltage applied to the first word line and the pass voltage applied to the second word line includes at least two ramp phases, and the pass voltage applied to the first word line and the pass voltage applied to the second word line have different ramp timings in at least one ramp phase among the other ramp phases after the first ramp phase.

In some examples, after the respective ramp phases end, the maximum voltage value of the first pass voltage and the maximum voltage value of the second pass voltage are equal.

It is to be noted that the memory device 150, memory cell array 1501 and peripheral circuit 1502 described herein are substantially similar to the memory device, the memory cell array and the peripheral circuit described in FIGS. 1-6 in terms of structure, and will not be described again herein.

According to yet another aspect of examples of the present application, there is provided a memory system including: one or more memory devices as described in any of the above examples; and a memory controller coupled with the memory devices and controlling the memory devices.

In some examples, the memory system is included in a solid-state drive SSD or a memory card.

It is to be noted that, as shown in FIGS. 1-3, the memory system may communicate with the host. Said host and/or said memory system may be included in various products such as Internet of Things (IOT) devices such as refrigerators or other devices, sensors, motors, mobile communication devices, automobiles, unmanned cars for supporting processing, communication or control of products. In an example, the memory system may be a discrete memory or memory component of a host device. In some other examples, the memory system may also be a part of an integrated circuit, such as a part of a system on chip (SOC). At this time, the memory system is stacked or otherwise assembled together with one or more components of the host. In some other examples, the afore-mentioned memory system may be implemented and packaged in products such as memory cards and drives. In one example, the memory controller and a single memory device in the memory system may be integrated into a memory card as specifically illustrated in FIG. 2. In another example, the memory controller and multiple memory devices may be integrated into an SSD, as specifically illustrated in FIG. 3.

In some examples, the afore-mentioned host may include a processor and a host RAM, wherein said host RAM may include DRAM, SDRAM or any other suitable non-volatile or volatile memory devices. Said memory system may be provided with one or more communication interfaces for communicating with one or more components in the host. Said one or more components in the host may be Serial Advanced Technology Attachment (SATA) interfaces, Peripheral Component Interconnect Express (PCIe) interfaces, Universal Serial Bus (USB) interfaces, Universal Flash Storage (UFS) interfaces, eMMC™ interfaces etc. The host may further include electronic components, memory card reader or one or more other electronic components external to the memory system.

In some examples, the memory controller may receive instructions from the host and communicate with said memory device. For example, the memory controller transfers data to one or more memory cells, planes, sub-blocks, blocks or pages in said memory device by executing write or erase instruction; or the memory controller transfers data to the host by executing read instructions. With respect to hardware, said memory controller may include one or more controller units, circuits or components configured to control access across said memory device and provide a transform layer between the host and said memory system. The memory controller may further include one or more input/output (I/O) circuits, wires or interfaces to transfer data to said memory device or transfer data from said memory device. The memory controller may further include a memory management unit and an array control unit. Said memory management unit may include circuit hardware or firmware such as a plurality of components or integrated circuits associated with various memory management functions. The memory system operation or management functions will be described with NAND memory as an example. It should be appreciated by those skilled in the art that other forms of non-volatile memories may have similar memory operation or management functions. The management functions of a NAND memory may include wear-leveling such as waste collection or recovering, error detection or correction, block rollback or a plurality of other memory management functions. The memory management unit may process the host's instructions into commands recognizable by said memory system, for example, resolving or formatting instructions received from the host into commands related to operations of said memory device. Alternatively, the memory management unit may also generate device commands for the array control unit or one or more other components of the memory system, such as commands for implementing various memory management functions. The memory management unit may be configured to include a group of management tables for maintaining various information associated with one or more components of the memory system, such as various information associated with the memory cell array coupled to the memory controller or one or more memory cells. For example, the management tables may contain information such as block ages, block erasing counts, error histories or one or more error counts of one or more blocks of the memory cells coupled to the memory controller. The error counts may include operation error counts, bit reading error counts etc. In some examples, in case that a detected error count is above a certain threshold, the bit error is uncorrectable. In some examples, management tables can maintain the counts of correctable or uncorrectable bit errors. The management tables may further contain one or more L2P tables containing one or more L2P pointers associated with the correct physical addresses at said memory device with logical addresses. In some examples, the management tables may contain unencrypted L2P tables and/or encrypted L2P tables. Unencrypted L2P tables may include L2P pointers indicating unencrypted logical addresses and unencrypted physical addresses; and encrypted L2P tables may include encrypted L2P pointers of encrypted physical addresses and unencrypted logical addresses. In practical application process, the management tables may be shown at the memory management unit. That is, the management tables may be stored in the RAM of the memory controller. In some other examples, the management tables may also be stored in the memory device. In use, the memory management unit may read partial or whole buffered management tables from the RAM of the memory controller; and may also read the management tables from the memory device.

The array control unit may include circuitries or components configured to control to complete the following related memory device operations. For example, the array control unit controls writing data into one or more memory cells coupled in the memory system of the memory controller, reading data from said one or more memory cells, or erasing said one or more memory cells. The array control unit may receive commands sent by the host, or host commands generated inside the memory management unit, wherein host commands may be commands associated with wear-leveling, error detection or correction.

The array control unit may further include an error correction code (ECC) component containing an ECC engine or other circuitries for detecting or correcting the following related errors that may be errors that might occur during the process of writing data into one or more memory cells coupled in the memory system of the memory controller or reading data from said one or more memory cells. The memory controller is configured to effectively detect error events related to various operations or data storage such as bit errors, operation errors etc., and restore from said error events, and at the same time maintain the integrity of data transferred between the host and the memory system or maintain the integrity of the stored data by for example using redundant RAID storage, and can remove, for example the memory resources with retirement failures such as memory cells, memory array, pages, blocks etc. for preventing future errors.

In the afore-mentioned memory system, in some examples, there is provided a memory device including: a memory cell array including a plurality of memory strings each including a plurality of memory cells;

a plurality of word lines each coupled with a corresponding memory cell in each memory string; and a periphery circuit coupled with the plurality of word lines and configured to:

apply a programming voltage on a selected word line;

apply a first pass voltage on a first word line adjacent to the selected word line; and apply a second pass voltage on a second word line adjacent to the selected word line;

wherein the first pass voltage and the second pass voltage include at least two ramp phases, and the first pass voltage and the second pass voltage have different ramp timings in at least one ramp phase among other ramp phases after the first ramp phase, and the ramp timing is the timing when the voltage value of the pass voltage starts to ramp up from a certain voltage value.

In the above-described solution, the at least two ramp phases include two ramp phases and the ramp timing of the second ramp phase of the second pass voltage precedes the ramp timing of the second ramp phase of the first pass voltage.

In the above-described solution, the time interval between the ramp timing of the second ramp phase of the first pass voltage and the ramp timing of the second ramp phase of the second pass voltage is influenced by the pulse width of the programming voltage and the ramp speed of the ramp phase of the programming voltage.

In the above-described solution, the peripheral circuit further includes a first voltage source and a second voltage source, wherein:

the first voltage source is configured to apply the first pass voltage to the first word line;

the second voltage source is configured to apply the second pass voltage to the second word line;

wherein when the maximum voltage value of the first pass voltage is given, the speed at which the first pass voltage reaches the maximum voltage value is controlled by controlling the pulse widths of the respective ramp phases provided by the first voltage source, and, when the maximum voltage value of the second pass voltage is given, the speed at which the second pass voltage reaches the maximum voltage value is controlled by controlling the pulse widths of the respective ramp phases provided by the second voltage source.

In the above-described solution, the peripheral circuit is further configured to apply a third pass voltage to other word lines other than the first word line, the second word line and the selected word line in the plurality of word lines; wherein, after the respective ramp phases end, the maximum voltage value of the third pass voltage is different from the maximum voltage values of the first pass voltage and the second pass voltage.

In the above-described solution, the programming of memory cells coupled with the selected word line includes a plurality of pulse phases:

in the previous pulse phase, a first sub-programming voltage is applied to the selected word line, and in the subsequent pulse phase, a second sub-programming voltage is applied to the selected word line; wherein the voltage value of the first sub-programming voltage is smaller than the voltage value of the second sub-programming voltage.

In the above-described solution, the programming of memory cells coupled with the selected word line includes a plurality of pulse phases, wherein in the previous pulse phase, a first sub-pass voltage is applied on the first word line, and a second sub-pass voltage is applied on the second word line;

in the subsequent pulse phase, a third sub-pass voltage is applied on the first word line, and a fourth sub-pass voltage is applied on the second word line;

wherein, after the respective ramp phases end, the voltage value of the first sub-pass voltage is smaller than the voltage value of the third sub-pass voltage; and the voltage value of the second sub-pass voltage is smaller than the voltage value of the fourth sub-pass voltage.

In the above-described solution, programming of memory cells coupled with the selected word line includes a plurality of pulse phases and in each pulse phase, each of the pass voltage applied to the first word line and the pass voltage applied to the second word line includes at least two ramp phases, and the pass voltage applied to the first word line and the pass voltage applied to the second word line have different ramp timings in at least one ramp phase among the other ramp phases after the first ramp phase.

In the above-described solution, after the respective ramp phases end, the maximum voltage value of the first pass voltage and the maximum voltage value of the second pass voltage are equal. It is to be noted that the memory system includes the afore-mentioned memory device and thus both of them have the same technical features. Terms appear in the memory system have been explained in detail in the above-mentioned memory device and apply equally herein, therefore will not be described any more.

According to an aspect of examples of the present application, there is provided a programming method for a memory device, including:

applying a programming voltage on a selected word line;

applying a first pass voltage on a first word line adjacent to the selected word line; and applying a second pass voltage on a second word line adjacent to the selected word line;

wherein the first pass voltage and the second pass voltage include at least two ramp phases, and the first pass voltage and the second pass voltage have different ramp timings in at least one ramp phase among other ramp phases after the first ramp phase, and the ramp timing is the timing when the voltage value starts to ramp up from a certain voltage value.

In the above-described solution, the at least two ramp phases include: two ramp phases;

a ramp timing of the second ramp phase of the second pass voltage precedes a ramp timing of the second ramp phase of the first pass voltage.

In the above-described solution, the time interval between the ramp timing of the second ramp phase of the first pass voltage and the ramp timing of the second ramp phase of the second pass voltage is influenced by the pulse width of the programming voltage and a ramp speed of a ramp phase of the programming voltage.

In the above-described solution, the first pass voltage and the second pass voltage are provided by different voltage sources, and when a maximum voltage value of the first pass voltage is given, a speed at which the first pass voltage reaches the maximum voltage value is controlled by controlling the pulse widths of the respective ramp phases provided by the voltage sources; or, when a maximum voltage value of the second pass voltage is given, a speed at which the second pass voltage reaches the maximum voltage value is controlled by controlling the pulse widths of the respective ramp phases provided by the voltage sources.

In the above-described solution, after the respective ramp phases end, the maximum voltage value of the first pass voltage and the maximum voltage value of the second pass voltage are equal.

In the above-described solution, said method further includes:

applying the third pass voltage to word lines other than the first word line, the second word line and the selected word line;

wherein, after the respective ramp phases end, the maximum voltage value of the third pass voltage is different from the maximum voltage values of the first pass voltage and the second pass voltage.

In the above-described solution, the programming of memory cells coupled with the selected word line includes a plurality of pulse phases;

wherein in the previous pulse phase, a first sub-programming voltage is applied to the selected word line; and in the subsequent pulse phase, a second sub-programming voltage is applied to the selected word line; and the voltage value of the first sub-programming voltage is smaller than the voltage value of the second sub-programming voltage.

In the above-described solution, the programming of memory cells coupled with the selected word line includes a plurality of pulse phases, wherein in the previous pulse phase, a first sub-pass voltage is applied on the first word line, and a second sub-pass voltage is applied on the second word line; and in the subsequent pulse phase, a third sub-pass voltage is applied on the first word line, and a fourth sub-pass voltage is applied on the second word line; and wherein, after the respective ramp phases end, the voltage value of the first sub-pass voltage is smaller than the voltage value of the third sub-pass voltage; and the voltage value of the second sub-pass voltage is smaller than the voltage value of the fourth sub-pass voltage.

In the above-described solution, programming of the memory cells coupled with the selected word line includes a plurality of pulse phases and in each pulse phase, each of the pass voltage applied to the first word line and the pass voltage applied to the second word line includes at least two ramp phases, and the pass voltage applied to the first word line and the pass voltage applied to the second word line have different ramp timings in at least one ramp phase among the other ramp phases after the first ramp phase.

According to another aspect of examples of the present application, there is provided a memory device, including:

a memory cell array including a plurality of memory strings each including a plurality of memory cells;

a plurality of word lines each coupled with a corresponding memory cell in each of the memory strings; and a periphery circuit coupled with the plurality of word lines and configured to:

apply a programming voltage on a selected word line;

apply a first pass voltage on a first word line adjacent to the selected word line; and apply a second pass voltage on a second word line adjacent to the selected word line;

wherein said first pass voltage and said second pass voltage include at least two ramp phases, and the first pass voltage and the second pass voltage have different ramp timings in at least one ramp phase among other ramp phases after the first ramp phase, and said ramp timing is the timing when the voltage value of the pass voltage starts to ramp up from a certain voltage value.

In the above-described solution, the at least two ramp phases include two ramp phases and the ramp timing of the second ramp phase of the second pass voltage precedes the ramp timing of the second ramp phase of the first pass voltage.

In the above-described solution, the time interval between the ramp timing of the second ramp phase of the first pass voltage and the ramp timing of the second ramp phase of the second pass voltage is influenced by the pulse width of the programming voltage and a ramp speed of a ramp phase of the programming voltage.

In the above-described solution, said peripheral circuit further includes a first voltage source and a second voltage source, wherein:

the first voltage source is configured to apply the first pass voltage to the first word line; and the second voltage source is configured to apply the second pass voltage to the second word line;

wherein when the maximum voltage value of the first pass voltage is given, the speed at which the first pass voltage reaches the maximum voltage value is controlled by controlling the pulse widths of the respective ramp phases provided by the first voltage source, and, when the maximum voltage value of the second pass voltage is given, the speed at which the second pass voltage reaches the maximum voltage value is controlled by controlling the pulse widths of the respective ramp phases provided by the second voltage source.

In the above-described solution, the peripheral circuit is further configured to apply a third pass voltage to other word lines other than the first word line, the second word line and the selected word line in the plurality of word lines; wherein, after the respective ramp phases end, the maximum voltage value of the third pass voltage is different from the maximum voltage values of the first pass voltage and the second pass voltage.

In the above-described solution, the programming of memory cells coupled with the selected word line includes a plurality of pulse phases;

wherein in the previous pulse phase, a first sub-programming voltage is applied to the selected word line; and in the subsequent pulse phase, a second sub-programming voltage is applied to the selected word line; and the voltage value of the first sub-programming voltage is smaller than the voltage value of the second sub-programming voltage.

In the above-described solution, the programming of memory cells coupled with the selected word line includes a plurality of pulse phases, wherein in the previous pulse phase, a first sub-pass voltage is applied on the first word line, and a second sub-pass voltage is applied on the second word line;

in the subsequent pulse phase, a third sub-pass voltage is applied on the first word line, and a fourth sub-pass voltage is applied on the second word line;

wherein, after the respective ramp phases end, the voltage value of the first sub-pass voltage is smaller than the voltage value of the third sub-pass voltage; and the voltage value of the second sub-pass voltage is smaller than the voltage value of the fourth sub-pass voltage.

In the above-described solution, programming of the memory cells coupled with the selected word line includes a plurality of pulse phases and in each pulse phase, each of the pass voltage applied to the first word line and the pass voltage applied to the second word line includes at least two ramp phases, and the pass voltage applied to the first word line and the pass voltage applied to the second word line have different ramp timings in at least one ramp phase among the other ramp phases after the first ramp phase.

In the above-described solution, after the respective ramp phases end, the maximum voltage value of the first pass voltage and the maximum voltage value of the second pass voltage are equal.

According to yet another aspect of examples of the present application, there is provided a memory system including: one or more memory devices as described in any of the above aspects; and a memory controller coupled to the memory devices and configured to control the memory devices.

In the above-described solution, said memory system is included in a solid-state drive SSD or a memory card.

Examples of the present application provide a programming method for a memory device, a memory device and a memory system. The programming method includes: applying a programming voltage on a selected word line; applying a first pass voltage on a first word line adjacent to the selected word line; and applying a second pass voltage on a second word line adjacent to the selected word line; wherein said first pass voltage and said second pass voltage include at least two ramp phases, and the first pass voltage and the second pass voltage have different ramp timings in at least one ramp phase among other ramp phases after the first ramp phase, and said ramp timing is the timing when the voltage value starts to ramp up from a certain voltage value. With the programming method provided in examples of the present application, the pass voltages each containing at least two ramp phases applied to the two word lines adjacent to the selected word line have different ramp timings in at least one ramp phase among other ramp phases after the first ramp phase, thereby improving programming disturb and increasing a read window margin.

The above description is intended to be illustrative rather than limiting. For example, the above-described examples (or one or more aspects thereof) may be used in combination with each other. Other examples may be used, such as those available for one of ordinary skill in the art upon reading the above description. It should be understood that it will not be used to interpret or limit the scope or meaning of the claims. Furthermore, in the above detailed description, various features may be combined to simplify the present disclosure. It should not be understood as meaning the disclosed features that have not been claimed are essential for any claims. To the contrary, the disclosed subject may lie in less than all features of specific disclosed examples. Accordingly, the appended claims are hereby incorporated in the detailed description, wherein each claim serves as a separate example independently and it is contemplated these examples may be combined with each other in various combinations or permutations. The scope of the present disclosure should be determined by the full scope of the appended claims and equivalents accorded by these claims.

What is claimed is:

1. A programming method for a memory device, comprising:

applying a programming voltage on a selected word line;

applying a first pass voltage on a first word line adjacent to the selected word line; and applying a second pass voltage on a second word line adjacent to the selected word line, wherein the first pass voltage and the second pass voltage include at least two successive ramp phases, the first pass voltage and the second pass voltage have different ramp timings in a second ramp phase after a first ramp phase and the second ramp phase begins at a first voltage of the first ramp phase, the first voltage being greater than any other voltage of the first ramp phase, and a ramp timing is a timing when a voltage value starts to ramp up from a certain voltage value.

2. The programming method of claim 1, wherein the at least two successive ramp phases include two ramp phases, and the ramp timing of the second ramp phase of the second pass voltage precedes the ramp timing of the second ramp phase of the first pass voltage.

3. The programming method of claim 2, wherein a time interval between the ramp timing of the second ramp phase of the first pass voltage and the ramp timing of the second ramp phase of the second pass voltage is influenced by a pulse width of the programming voltage and a ramp speed of a ramp phase of the programming voltage.

4. The programming method of claim 1, wherein the first pass voltage and the second pass voltage are provided by different voltage sources, and when a maximum voltage value of the first pass voltage is given, a speed at which the first pass voltage reaches the maximum voltage value of the first pass voltage is controlled by controlling pulse widths of the respective ramp phases provided by a first voltage source; or when a maximum voltage value of the second pass voltage is given, a speed at which the second pass voltage reaches the maximum voltage value of the second pass voltage is controlled by controlling the pulse widths of the respective ramp phases provided by a second voltage source.

5. The programming method of claim 1, wherein after respective ramp phases end, a maximum voltage value of the first pass voltage and a maximum voltage value of the second pass voltage are equal.

6. The programming method of claim 1, further including applying a third pass voltage to other word lines other than the first word line, the second word line, and the selected word line, wherein, after respective ramp phases end, a maximum voltage value of the third pass voltage is different from the maximum voltage values of the first pass voltage and the second pass voltage.

7. The programming method of claim 1, wherein applying the programming voltage on the selected word line includes applying the programming voltage including a plurality of pulse phases, wherein:

in a previous pulse phase, a first sub-programming voltage is applied to the selected word line; and in a subsequent pulse phase, a second sub-programming voltage is applied to the selected word line, a voltage value of the first sub-programming voltage is smaller than a voltage value of the second sub-programming voltage.

8. The programming method of claim 1, wherein applying the programming voltage on the selected word line includes applying the programming voltage including a plurality of pulse phases, wherein:

in a previous pulse phase, a first sub-pass voltage is applied on the first word line, and a second sub-pass voltage is applied on the second word line; and in a subsequent pulse phase, a third sub-pass voltage is applied on the first word line, and a fourth sub-pass voltage is applied on the second word line, wherein, after respective ramp phases end, a voltage value of the first sub-pass voltage is smaller than a voltage value of the third sub-pass voltage, and a voltage value of the second sub-pass voltage is smaller than a voltage value of the fourth sub-pass voltage.

9. The programming method of claim 1, wherein applying the programming voltage on the selected word line includes applying the programming voltage including a plurality of pulse phases and, in a pulse phase of the plurality of pulse phases, a pass voltage applied to the first word line and a pass voltage applied to the second word line include at least two ramp phases, and the pass voltage applied to the first word line and the pass voltage applied to the second word line have different ramp timings in at least one ramp phase among other ramp phases after the first ramp phase.

10. A memory device, comprising:

a memory cell array including a plurality of memory strings including a plurality of memory cells;

a plurality of word lines, a word line of the plurality of word lines coupled with a corresponding memory cell in the plurality of memory strings; and a periphery circuit coupled with the plurality of word lines and configured to:

apply a programming voltage on a selected word line;

apply a first pass voltage on a first word line adjacent to the selected word line; and apply a second pass voltage on a second word line adjacent to the selected word line, wherein the first pass voltage and the second pass voltage include at least two successive ramp phases, the first pass voltage and the second pass voltage have different ramp timings in a second ramp phase after a first ramp phase and the second ramp phase begins at a first voltage of the first ramp phase, the first voltage being greater than any other voltage of the first ramp phase, and a ramp timing is a timing when a voltage value starts to ramp up from a certain voltage value.

11. The memory device of claim 10, wherein the at least two successive ramp phases include two ramp phases and a ramp timing of the second ramp phase of the second pass voltage precedes the ramp timing of the second ramp phase of the first pass voltage.

12. The memory device of claim 11, wherein a time interval between the ramp timing of the second ramp phase of the first pass voltage and the ramp timing of the second ramp phase of the second pass voltage is influenced by a pulse width of the programming voltage and a ramp speed of a ramp phase of the programming voltage.

13. The memory device of claim 10, wherein the peripheral circuit further includes a first voltage source and a second voltage source, wherein:

the first voltage source is configured to apply the first pass voltage to the first word line; and the second voltage source is configured to apply the second pass voltage to the second word line, wherein:

when a maximum voltage value of the first pass voltage is given, a speed at which the first pass voltage reaches the maximum voltage value of the first pass voltage is controlled by controlling pulse widths of the respective ramp phases provided by the first voltage source; and when a maximum voltage value of the second pass voltage is given, a speed at which the second pass voltage reaches the maximum voltage value of the second pass voltage is controlled by controlling the pulse widths of the respective ramp phases provided by the second voltage source.

14. The memory device of claim 10, wherein the peripheral circuit is further configured to apply a third pass voltage to other word lines other than the first word line, the second word line, and the selected word line in the plurality of word lines, wherein, after respective ramp phases end, a maximum voltage value of the third pass voltage is different from the maximum voltage values of the first pass voltage and the second pass voltage.

15. The memory device of claim 10, wherein to apply the programming voltage on the selected word line includes applying the programming voltage including a plurality of pulse phases, wherein:

in a previous pulse phase, a first sub-programming voltage is applied to the selected word line; and in a subsequent pulse phase, a second sub-programming voltage is applied to the selected word line, a voltage value of the first sub-programming voltage is smaller than a voltage value of the second sub-programming voltage.

16. The memory device of claim 10, wherein to apply the programming voltage on the selected word line includes applying the programming voltage including a plurality of pulse phases:

in a previous pulse phase, a first sub-pass voltage is applied on the first word line, and a second sub-pass voltage is applied on the second word line; and in a subsequent pulse phase, a third sub-pass voltage is applied on the first word line, and a fourth sub-pass voltage is applied on the second word line, wherein, after respective ramp phases end, a voltage value of the first sub-pass voltage is smaller than a voltage value of the third sub-pass voltage, and a voltage value of the second sub-pass voltage is smaller than a voltage value of the fourth sub-pass voltage.

17. The memory device of claim 10, wherein to apply the programming voltage on the selected word line includes applying the programming voltage including a plurality of pulse phases and, in a pulse phase of the plurality of pulse phases, a pass voltage applied to the first word line and a pass voltage applied to the second word line include at least two ramp phases, and the pass voltage applied to the first word line and the pass voltage applied to the second word line have different ramp timings in at least one ramp phase of other ramp phases after the first ramp phase.

18. The memory device of claim 10, wherein, after respective ramp phases end, a maximum voltage value of the first pass voltage and a maximum voltage value of the second pass voltage are equal.

19. A memory system, comprising:

one or more memory devices, including:

a memory cell array including a plurality of memory strings including a plurality of memory cells;

a plurality of word lines, a word line of the plurality of word lines coupled with a corresponding memory cell in the plurality of memory strings; and a periphery circuit coupled with the plurality of word lines and configured to:

apply a programming voltage on a selected word line;

apply a first pass voltage on a first word line adjacent to the selected word line; and apply a second pass voltage on a second word line adjacent to the selected word line, wherein the first pass voltage and the second pass voltage include at least two successive ramp phases, the first pass voltage and the second pass voltage have different ramp timings in a second ramp phase after a first ramp phase and the second ramp phase begins at a first voltage of the first ramp phase, the first voltage being greater than any other voltage of the first ramp phase, and a ramp timing is a timing when a voltage value starts to ramp up from a certain voltage value; and a memory controller coupled with the one or more memory devices and configured to control the one or more memory devices.

20. The memory system of claim 19, wherein the memory system is included in a solid-state drive (SSD) or a memory card.

* * * * *